(12) United States Patent
Shirakawa et al.

(10) Patent No.: US 8,524,324 B2
(45) Date of Patent: Sep. 3, 2013

(54) COMPLEX OXIDE FILM AND METHOD FOR PRODUCING SAME, DIELECTRIC MATERIAL INCLUDING COMPLEX OXIDE FILM, PIEZOELECTRIC MATERIAL, CAPACITOR, PIEZOELECTRIC ELEMENT, AND ELECTRONIC DEVICE

(75) Inventors: Akihiko Shirakawa, Chiba (JP); Hirofumi Fukunaga, Chiba (JP); Chunfu Yu, Chiba (JP)

(73) Assignee: Showa Denko K.K., Tokyo (JP)

( * ) Notice: Subject to any disclaimer, the term of this patent is extended or adjusted under 35 U.S.C. 154(b) by 746 days.

(21) Appl. No.: 11/997,090

(22) PCT Filed: Jul. 28, 2006

(86) PCT No.: PCT/JP2006/314997
§ 371 (c)(1),
(2), (4) Date: Jan. 28, 2008

(87) PCT Pub. No.: WO2007/013596
PCT Pub. Date: Feb. 1, 2007

(65) Prior Publication Data
US 2010/0220428 A1    Sep. 2, 2010

(30) Foreign Application Priority Data
Jul. 29, 2005    (JP) ................. 2005-221334

(51) Int. Cl.
*B05D 3/10* (2006.01)
*B05D 3/14* (2006.01)

(52) U.S. Cl.
USPC ......... 427/337; 205/199; 205/200; 361/321.5

(58) Field of Classification Search
USPC ................. 427/337, 333, 343; 205/199, 200; 361/321.5; 423/598
See application file for complete search history.

(56) References Cited

U.S. PATENT DOCUMENTS
2,218,655 A    10/1940 Peterson
4,078,493 A    3/1978 Miyamoto
(Continued)

FOREIGN PATENT DOCUMENTS
JP    60-116119 A    6/1985
JP    60116119    6/1985
(Continued)

OTHER PUBLICATIONS

Hu et al. "Wet-chemical synthesis of monodispersed barium titanate particles—hydrothermal conversion of TiO2 microspheres to nanocrystalline BaTiO3". Powder Technology 110 (2000) 2-14.*

(Continued)

*Primary Examiner* — Michael Cleveland
*Assistant Examiner* — Alexander Weddle
(74) *Attorney, Agent, or Firm* — Sughrue Mion, PLLC

(57) ABSTRACT

The invention relates to a method for a complex oxide film having a high relative dielectric constant formed on a substrate surface by wet-treatment method and a production process of the complex oxide film comprising a step of washing the complex oxide film with an acid solution of pH 5 or less to thereby reduce salts in the film. Further, the invention relates to a dielectric material and a piezoelectric material containing the complex oxide film, a capacitor and a piezoelectric element including the material, and a electronic device comprising the element.

8 Claims, 1 Drawing Sheet

(56) References Cited

U.S. PATENT DOCUMENTS

| | | | |
|---|---|---|---|
| 4,587,041 A | 5/1986 | Uedaira et al. | |
| 5,328,718 A | 7/1994 | Abe et al. | |
| 5,790,368 A | 8/1998 | Naito et al. | |
| 6,126,743 A | 10/2000 | Saegusa et al. | |
| 2002/0146365 A1* | 10/2002 | Cho et al. | 423/598 |
| 2003/0010407 A1 | 1/2003 | Arai | |
| 2003/0170559 A1* | 9/2003 | Mizutani et al. | 430/270.1 |
| 2004/0238848 A1 | 12/2004 | Arai | |
| 2006/0078492 A1 | 4/2006 | Kurozumi et al. | |
| 2007/0205389 A1 | 9/2007 | Kurozumi et al. | |
| 2010/0220428 A1 | 9/2010 | Shirakawa et al. | |
| 2010/0227197 A1 | 9/2010 | Shirakawa | |
| 2010/0232087 A1 | 9/2010 | Shirakawa | |

FOREIGN PATENT DOCUMENTS

| | | |
|---|---|---|
| JP | 61-30678 A | 2/1986 |
| JP | 61030678 | 2/1986 |
| JP | 5-124817 A | 5/1993 |
| JP | 05124817 | 5/1993 |
| JP | 5-339770 A | 12/1993 |
| JP | 05339770 | 12/1993 |
| JP | 06211523 | 2/1994 |
| JP | 6-211523 A | 8/1994 |
| JP | 7-33579 A | 2/1995 |
| JP | 0733579 | 2/1995 |
| JP | 07086077 | 3/1995 |
| JP | 9017686 A | 1/1997 |
| JP | 09315857 | 9/1997 |
| JP | 9-315857 A | 12/1997 |
| JP | 11031857 A * | 2/1999 |
| JP | 11172489 | 6/1999 |
| JP | 2000-150295 A | 5/2000 |
| JP | 2000150295 | 5/2000 |
| JP | 2000-299247 A | 10/2000 |
| JP | 2000299247 | 10/2000 |
| JP | 2003-206135 A | 7/2003 |
| JP | 2003206135 | 7/2003 |
| JP | 2005162594 | 6/2005 |
| JP | 2005306728 A | 11/2005 |
| WO | 2004092070 A1 | 10/2004 |

OTHER PUBLICATIONS

Yoshimura et al. "Preparation of BaTiO3 Thin Film by Hydrothermal Electrochemical Method". Japanese Journal of Applied Physics (28)11 (1989) 2007-2009.*

Masahiro Yoshimura et al., Preparation of BaTiO3 Thin Film by Hydrothermal Electrochemical Method, Japanese Journal of Applied Physics, Nov. 20, 1989, L2007-L2009, vol. 28, No. 11 (Abstract).

Final Office Action issued in Application No. 1259492 dated Nov. 23, 2012.

Non-Final Office Action issued in Application No. 12159492 dated May 24, 2012.

Advisory Action issued in Application No. 12159492 dated Jan. 20, 2012.

Final Office Action issued in Application No. 12159492 dated Sep. 29, 2011.

Non-Final Office Action issued in Application No. 12159492 dated Apr. 4, 2011.

Notice of Allowance issued in Application No. 12159560 dated Feb. 8, 2013.

Final Office Action issued in Application No. 12159560 dated Oct. 3, 2012.

Non-Final Office Action issued in Application No. 12159560 dated Jun. 8, 2012.

Advisory Action issued in Application No. 12159560 dated Feb. 8, 2012.

Final Office Action issued in Application No. 12159560 dated Oct. 21, 2011.

Non-Final Office Action issued in Application No. 12159560 dated Apr. 5, 2011.

Notice of Allowance issued in Application No. 12159492 dated Apr. 3, 2013.

Notice of Allowance issued in Application No. 12159560 dated Apr. 2, 2013.

"Preparation of BaTiO$_2$ Thin Film by Hydrothermal Electrochemical Method", Masahiro Yoshimura, Japanese Journal of Applied Physics, vol. 28, No. 11, Nov., 1989, pp. L2007-L2009.

"Wet-chemical Synthesis of Monodispersed Barium Titanate Particles-Hydrothermal Conversion of $TiO_2$ Microspheres to Nanocrystalline BaTiO$_3$," Michael Z.-C Hu, Powder Technology 110 (2000) 2-14.

* cited by examiner

COMPLEX OXIDE FILM AND METHOD FOR PRODUCING SAME, DIELECTRIC MATERIAL INCLUDING COMPLEX OXIDE FILM, PIEZOELECTRIC MATERIAL, CAPACITOR, PIEZOELECTRIC ELEMENT, AND ELECTRONIC DEVICE

TECHNICAL FIELD

The present invention relates to a complex oxide film having a high relative dielectric constant and a production method thereof, a dielectric material containing the complex oxide film, a piezoelectric material, a capacitor including a complex oxide film which is advantageous in increasing electrostatic capacitance, a piezoelectric element, and a electronic device comprising these electronic components.

BACKGROUND OF THE INVENTION

Conventionally, as small-sized, large-capacitance capacitors, multilayer ceramic capacitors, tantalum electrolytic capacitors, and aluminum electrolytic capacitors are in practical use. A multilayer ceramic capacitor, which uses as a dielectric body a complex oxide such as barium titanate having a large relative dielectric constant, involves a thick-film process, which causes thickness of a dielectric layer to be 1 μm or more. Electrostatic capacitance is in inverse proportion to thickness of dielectric layer and therefore, it is difficult to achieve downsizing and increasing the capacitance at the same time.

On the other hand, a tantalum electrolytic capacitor and an aluminum electrolytic capacitor use as dielectric body, tantalum oxide or aluminum oxide which is obtained by subjecting metal tantalum or metal aluminum to anode oxidation. Since the thickness of the dielectric layer can be controlled by selecting the anode oxidation voltage, it is possible to obtain a thin dielectric layer having a thickness of 0.1 μm or less. However, both tantalum oxide and aluminum oxide have a small relative dielectric constant as compared with that of a complex oxide such as barium titanate, it is difficult to achieve downsizing and increasing in capacitance.

In order to solve the above problems in conventional techniques, many attempts to form a complex oxide thin film on a substrate have been made.

Patent Documents 1 and 2 disclose technique for forming a thin film of barium titanate by chemically forming a metal titanium substrate in a strong alkali solution containing barium ions. Patent Document 3 (related Patent Document: U.S. Pat. No. 5,328,718) discloses technique for forming a thin film of barium titanate on a substrate by alkoxide method. Patent Document 4 discloses a technique for forming a composite titanate film, in which a metal titanium substrate is treated in an aqueous solution of alkali metal to thereby form a titanate salt on the substrate surface and is further treated in an aqueous solution containing other metal ions such as barium ions to thereby substitute the alkali metal with other metals such as barium. Also, Non-Patent Document 1 discloses a technique for obtaining a thin film of barium titanate by hydrothermal-electrochemical technique.

[Patent Document 1] Japanese Patent Application Laid-Open No. S60-116119

[Patent Document 2] Japanese Patent Application Laid-Open No. S61-30678

[Patent Document 3] Japanese Patent Application Laid-Open No. H05-124817

[Patent Document 4] Japanese Patent Application Laid-Open No. 2003-206135

[Non-Patent Document 1] Japanese Journal of Applied Physics Vol. 28, No. 11, November, 1989, L2007-L2009

SUMMARY OF THE INVENTION

Problems to be Solved by Invention

However, in all of the above mentioned techniques, the ratio between alkali earth metal such as barium and titanium cannot be controlled and the amount of alkali earth metal always becomes excessive. Excessive alkali earth metal reacts with carbonate ions present in the air or in the reaction solution to generate carbonate salts of the alkali earth metal. Because of such an unnecessary carbonate salt of the alkali earth metal, a complex oxide film obtained by conventional technique has a low relative dielectric constant and a capacitor using such a complex oxide film as dielectric body involves disadvantages such as high leakage current. Such defects due to presence of carbonate salts can occur in cases using metals such as lead, other than alkali earth metals.

The object of the present invention is to solve the above problems and then provide a complex oxide film, substantially free from carbonate salt of alkali earth metal and having a high relative dielectric constant, production method thereof, a dielectric material and a piezoelectric material which contain the complex oxide film, a capacitor and a piezoelectric element which include the material, and an electronic device comprising the element.

Means for Solving the Problems

As a result of intensive studies made with a view to solving the problems, the present inventors have found out that the object can be achieved by the following means.

(1) A method for producing a complex oxide film, comprising a step of forming the complex oxide film on a substrate surface by wet-treatment method and a step of washing the complex oxide film with an acid solution of pH 5 or less.

(2) A method for producing a complex oxide film, comprising a step of forming a metal oxide film containing a first metal element on a substrate surface, a step of allowing a solution containing a second metal ion to react with the metal oxide film containing the first metal element to form the complex oxide film containing the first and second metal elements and a step of washing the complex oxide film with an acid solution of pH 5 or less.

(3) The method for producing a complex oxide film as described in the above item (2), wherein the first metal is titanium.

(4) The method for producing a complex oxide film as described in any one of the above items (2) or (3), wherein the second metal is an alkali earth metal or lead.

(5) The method for producing a complex oxide film as described in any of the above items (2) to (4), wherein the substrate is metal titanium or an alloy containing titanium.

(6) The method for producing a complex oxide film as described in the above item (2), wherein the metal oxide layer is formed by anode oxidation of the substrate.

(7) The method for producing a complex oxide film as described in any of the above items (2) to (6), wherein the solution containing a second metal ion is an alkaline solution of pH 11 or more.

(8) The method for producing a complex oxide film as described in any of the above items (2) to (7), wherein the solution containing a second metal ion is allowed to react with the first metal oxide layer at 40° C. or higher.

(9) The method for producing a complex oxide film as described in any of the above items (2) to (8), wherein the solution containing a second metal ion contains a basic compound which turns into gas through at least one of evaporation, sublimation and thermal decomposition at atmospheric pressure or under reduced pressure.

(10) The method for producing a complex oxide film as described in the above item (9), wherein the basic compound is an organic basic compound.

(11) The method for producing a complex oxide film as described in the above item (10), wherein the organic basic compound is tetramethyl ammonium hydroxide.

(12) A complex oxide film produced by the method as described in any of the above items (1) to (11).

(13) The complex oxide film as described in the above item (12), wherein the ratio of carbon dioxide gas amount generated at 650° C. to carbon dioxide gas amount generated at 450° C. when the temperature is elevated at 60° C./minute in vacuum of $1 \times 10^{-3}$ Pa or less is 2 or less.

(14) A complex oxide film formed on surface of metal titanium or an alloy containing titanium, comprising at least one metal element selected from a group consisting of titanium, metal titanium and lead, wherein the ratio of carbon dioxide gas amount generated at 450° C. to carbon dioxide gas amount generated at 650° C. when the temperature is elevated at 60° C./minute in vacuum of $1 \times 10^{-3}$ Pa or less is 2 or less.

(15) The complex oxide film as described in the above item (14), wherein the metal titanium or an alloy containing titanium is a foil having a thickness of 5 to 300 μm.

(16) The complex oxide film as described in the above item (14), wherein the metal titanium or an alloy containing titanium is a sintered body of particles having an average particle size of 0.1 to 20 μm.

(17) The complex oxide film as described in any of the above items (12) to (16), comprising a perovskite compound as the composite oxide.

(18) A dielectric material comprising the complex oxide film as described in any of the above items (12) to (17).

(19) A piezoelectric material comprising the complex oxide film as described in any of the above items (12) to (17).

(20) A capacitor comprising the dielectric material as described in the above item (18).

(21) A piezoelectric element comprising the piezoelectric material as described in the above item (19).

(22) An electronic device comprising the capacitor as described in the above item (20).

(23) An electronic device comprising the piezoelectric element as described in the above item (21).

EFFECTS OF INVENTION

According to the production method of the present invention of the complex oxide film, a complex oxide film substantially free from carbonate salt can be produced by extremely simple method where a complex oxide film formed by wet-treatment method is washed with an acid solution of pH 5 or less to thereby reduce carbonate salts contained in the complex oxide film. The present invention, which does not require any complicated or large scale equipment, enables production of good-quality complex oxide film at low cost. By forming a metal oxide film containing a first metal element and having a predetermined film thickness on a substrate surface and then allowing a solution containing a second metal ion to react with the metal oxide film containing the first metal element to form the complex oxide film containing the first and second metal elements, a complex oxide film having a desired thickness can be obtained, since there are correlations between the film thickness of the complex oxide film after the reaction and types of materials used and production conditions.

By using a metal titanium or an alloy containing titanium as substrate and subjecting the substrate to anode oxidation to form a titanium oxide film, film thickness of the titanium oxide film can be easily controlled. By allowing an aqueous solution containing at least one kind of metal ion selected from alkali earth metals and lead with the titanium oxide film, a strong dielectric film having a high relative dielectric constant can be formed.

Here, by using an alkaline solution of pH 11 or more as a solution containing a second metal ion, a strong dielectric film having high crystallinity can be formed, with a high relative dielectric constant. By using as an alkali component in the solution a basic compound which turns into gas through at least one of evaporation, sublimation and thermal decomposition at atmospheric pressure or under reduced pressure, deterioration in properties of the complex oxide film caused by alkali components remaining in the film can be suppressed, whereby the complex oxide film having stable properties can be obtained. Moreover, by employing a temperature of 40° C. or higher, the reaction process can be more ensured.

Undesirable carbonate salts of alkali earth metal contained in the formed complex oxide film can be removed by washing the film with an acid solution of pH 5 or less. In the thus obtained complex oxide film, the ratio of carbon dioxide gas amount generated at 650° C. to carbon dioxide gas amount generated at 450° C. when the temperature is elevated at 60° C./minute in vacuum of $1 \times 10^{-3}$ Pa or less is 2 or less, and thereby the amount of carbonate salt is reduced therein and a high relative dielectric constant is obtained. By using as substrate a 5-to-300 μm-thick sintered body of metal-titanium- or titanium-containing alloy fine particles of an average particle size of 0.1 to 20 μm, the ratio of the complex oxide film against the substrate can be increased, which makes the capacitor element more suitable for an electronic component used in a capacitor or the like. Thus, the invention enables downsizing of electronic parts and further downsizing and reduction in weight of electronic devices using such a part.

DETAILED DESCRIPTION OF THE INVENTION

Hereinafter, embodiments of the complex oxide film and production process of the present invention are explained in detail.

The complex oxide film of the present invention can be obtained by a production method comprising a step of forming a complex metal oxide film by wet-treatment method and a step of washing the complex oxide film obtained in the preceding step with an acid solution of pH 5 or less. There is no particular limitation on the material of the substrate and any of conductive material, semiconductor and insulative material may be used depending on uses. Preferred examples of material suitable for the substrate used in capacitors include alloys containing metal titanium or titanium as a conductor. On a substrate made of such a metal, a complex oxide film is formed as a dielectric body so that the metal substrate itself can serve as an electrode of a capacitor. There is no particular limitation on the shape of the substrate, either. The substrate may have a shape of plate or foil and further may have an uneven surface. For the substrate to be used in a capacitor, the larger the surface area per weight is, the larger the ratio of the complex oxide film against the substrate and the more advantageous. From viewpoints of obtaining this advantage, downsizing and reducing the weight in the capacitor, it is preferable to use a foil-shaped substrate having a thickness of 5 to 300 μm, more preferably 5 to 100 μm, still more preferably 5 to 30 µm. When a foil is used as a substrate, its surface area can be increased by subjecting the foil to chemical etching with fluorinated acid or electrolytic etching in advance to thereby roughen the surface. A sintered body of metal-titanium- or titanium-containing alloy fine particles of an average particle size of 0.1 to 20 µm, preferably 1 to 10 µm can be used as well, so that the ratio of the complex oxide film against the substrate may be increased.

There is no particular limitation on wet treatment. Conventional methods described in the aforementioned Patent Documents 1 and 2 may be used. From a viewpoint of controlling the film thickness of the complex oxide film, however, it is preferable that a production method comprising a step of forming a metal oxide film containing a first metal element on a substrate surface and a step of allowing a solution containing a second metal ion to react with the metal oxide film containing the first metal element to form the complex oxide film containing the first and second metal elements be used. In this method, first, a metal oxide layer of a predetermined thickness, containing a first metal element, is firmed on the substrate surface. There is no particular limitation on formation method of the metal oxide layer. In a case where a metal is employed as a substrate, the metal constituting the substrate may be different from or the same with the first metal element constituting the metal oxide layer. In the former case, for example, dry process such as sputtering method and plasma deposition method may be employed.

From a viewpoint of low-cost production, however, it is preferable to employ wet process such as sol-gel method and electrolytic plating. In the latter case, similar methods may be employed and the layer can be formed also by natural oxidation, thermal oxidation or anode oxidation of the substrate surface or the like. Particularly preferred is anode oxidation in that film thickness can be easily controlled by adjusting the voltage. Preferred examples include a case where titanium is used as the first metal element, that is, a titanium oxide film is formed on a substrate surface consisting of an alloy containing metal titanium or titanium. Here the term "titanium oxide" means a general formula $TiO_x \cdot nH_2O$ ($0.5 \leq x \leq 2$, $0 \leq n \leq 2$). The thickness of the oxide film may be adjusted according to the thickness of the complex oxide film as desired and preferred thickness range of the oxide film is from 1 to 4000 nm, more preferably 5 to 2000 nm.

Here the term "perovskite compound" include typical kinds of perovskite compound having a crystalline structure, represented by $ABX_3$, i.e., those compounds generally represented by $BaTiO_3$, $PbZrO_3$, and $(Pb_xLa_{(1-x)})(Zr_yTi_{(1-y)})O_3$.

In the anode oxidation treatment, chemical formation is conducted by immersing a predetermined portion of titanium in a chemical-formation liquid and applying predetermined voltage and current density. In order to stabilize the liquid level of the chemical-formation liquid used for immersion, it is preferable to apply masking material on a predetermined portion when the chemical formation is carried out. As masking material, general heat-resistant resins, preferably heat resistant resins soluble or swellable in solvents or precursors thereof, composition consisting of inorganic fine powder and cellulose resin (see JP-A-H11-80596) can be used, however, the invention is not limited by these materials. Specific examples thereof include polyphenylsulfone (PPS), polyethersulfone (PES), cyanate ester resin, fluorine resin (tetrafluoroethylene, tetrafluoroethylene-perfluoroalkylvinylether copolymer), polyimide and derivatives thereof. Preferred among them are polyimide, polyethersulfone, fluororesin and precursors thereof. Most preferred is polyimide, which has a sufficient adhesive property to valve-action metal, fillability in valve-action metal, an excellent insulating property, and is endurable to treatment at a high temperature up to about 450° C. A polyimide sufficiently curable by heat treatment at 200° C. or lower, preferably at a low temperature from 100 to 200° C. and less susceptible to external impacts such as heat of a dielectric layer on anode foil surface which may cause damage or destruction to the resin can be preferably employed.

A preferred range of the average molecular weight of polyimide is from about 1000 to 1,000,000, more preferably from about 2000 to 200,000.

These resins can be dissolved or dispersed in organic solvent and the solid concentration (viscosity) thereof can be easily adjusted to be a solution or dispersion of an arbitrary concentration which is suitable for coating operation. A preferred range of the concentration is from about 10 to 60 mass %, more preferably from about 15 to 40 mass %. With too low a concentration, the masking line will blur while with too high a concentration, the masking material becomes so sticky that the width of the masking line will be unstable.

Electrolytic oxidation is conducted under the following conditions: electrolysis solution containing at least one selected from acids and/or salts thereof such as phosphoric acid, sulfuric acid, oxalic acid, boric acid, adipic acid and salts thereof is used; the concentration of the electrolysis solution is within a range of 0.1 to 30 mass %; the temperature is within a range of 0 to 90° C.; the current density is within a range of 0.1 to 1000 mA/cm$^2$; the voltage is within a range of 2 to 400 V; time is within a range of 1 millisecond to 400 minutes; and constant-current chemical formation is conducted by using valve-action metal as anode and after the voltage has reached a specified voltage, constant-voltage chemical formation is carried out. More preferred conditions are to be selected from the followings: the concentration of the electrolysis solution is within a range of 1 to 20 mass %; the temperature is within a range of 20 to 80° C.; the current density is within a range of 1 to 400 mA/cm$^2$; the voltage is within a range of 5 to 70 V; and time is from 1 second to 300 minutes.

Next, a solution containing a second metal ion is allowed to react with the above formed metal oxide film containing the first metal element. By this reaction, the first metal oxide film is turned into a complex oxide film containing the first and second metal elements. There is no particular limitation on the second metal as long as the metal can react with the first metal oxide to thereby achieve a high relative dielectric constant in the complex oxide film. Preferable examples include alkali earth metals such as calcium, strontium and barium and lead. The first metal oxide film is reacted with a solution containing at least one of these metal ions. It is preferable that the solution be aqueous. Examples thereof include aqueous solutions of metal compounds such as hydroxide, nitrate salt, acetate salt and chloride. One of these compounds may be used alone or two or more kinds of them may be used in mixture at an arbitrary mixing ratio. Examples thereof include calcium chloride, calcium nitrate, calcium acetate, strontium chloride, strontium nitrate, barium hydroxide, barium chloride, barium nitrate, barium acetate, lead nitrate, and lead acetate.

As a condition for this reaction, it is preferable that reaction be conducted in an alkaline solution where a basic compound is present. The preferred pH of the solution is 11 or more, more preferably 13 or more, particularly preferably 14 or more. With a high pH, the complex oxide film can be obtained with a higher crystallinity. The higher the crystallinity is, the higher the relative dielectric constant can be and the more preferable. It is preferable that the reaction solution be kept in an alkaline state of pH 11 or more, for example, by adding an organic alkali compound. There is no particular limitation on alkali components to be added. Preferred is a substance which can turn into gas at a sintering temperature or lower at atmospheric pressure or under reduced pressure, through evaporation, sublimation and/or thermal decomposition. Preferred examples thereof include TMAH (tetramethylammonium hydroxide) and choline. If an alkali metal hydroxide such as lithium hydroxide, sodium hydroxide or potassium hydroxide is added, alkali metal will remain in the obtained complex oxide film, which may cause deterioration in properties of final products to serve as functional materials such as dielectric material and piezoelectric material. For this reason, the above alkali components such as tetramethylammonium hydroxide are preferred.

It is preferable that in the solution, the total number of moles of the second metal ion be adjusted to be 1 to 1000 times the number of moles of the first metal oxide formed on the substrate surface To the preferred metal compound, a compound containing at least one element selected from a group consisting of Sn, Zr, La, Ce, Mg, Bi, Ni, Al, Si, Zn, B, Nb, W, Mn, Fe, Cu and Dy may be added, such that the concentration of the element in the complex oxide film after the reaction can be less than 5 mol %.

The thus prepared alkaline solution is allowed to cause reaction while stirred and retained, generally at a temperature of 40° C. to the boiling point of the solution, preferably 80° C. to the boiling point of the solution, under normal pressure. The reaction time is generally 10 minutes or more, preferably 1 hour or more. The obtained sample is subjected to electrodialysis, ion exchange, washing with water, permeation membrane treatment or the like if necessary, to thereby remove impurity ions therefrom.

Subsequently, the substrate having the complex oxide film formed thereon is immersed in an acid solution of pH 5 or less, preferably pH 0 to 4, more preferably pH 1 to 4, to thereby dissolve and remove excessive carbonate salts of alkali earth metal, and then the substrate is dried. Since acid of pH 5 or less dissolves carbonate salts, carbonate salts present in the complex oxide film can be removed. Drying can be carried out at normal temperature to 150° C. for 1 to 24 hours. There is no particular limitation on the drying atmosphere and drying can be conducted in the air or under reduced pressure.

Further, in the present invention, the ratio of carbon dioxide gas amounts generated in vacuum: (the generated amount of carbon dioxide gas at 650° C./the generated amount of carbon dioxide gas at 450° C.) can be used as an index in evaluating properties of the complex oxide film.

That is, it is assumed that, in conventional method, a peak in gas generation peak at a lower temperature range is based on the carbon dioxide gas amount adsorbed onto the complex oxide film while a peak at a higher temperature range is based on the amount of the remaining carbonate salt. (However, in the present invention, theses peaks are not limited by a specific mechanism.) In a conventional complex oxide film, a carbon dioxide gas generation peak is present both at a temperature range of 450° C. or lower and at a temperature range of 650° C. or higher. On the other hand, in the complex oxide film having improved properties according to the present invention, carbon dioxide gas generation at a temperature range exceeding 450° C. can be reduced to a low level. A complex oxide film having a large value as the above ratio, has a low relative dielectric constant and for example, when the film is used as a dielectric body in a capacitor, a large electrostatic capacitance cannot be obtained.

More specifically, it is preferable that the carbon dioxide gas generation ratio of the generated amount of carbon dioxide gas at 650° C. against the generated amount of carbon dioxide gas at 450° C. be 2 or less, more preferably 1 or less, when the complex oxide film (which may be a composite body of a substrate and the film) is heated in vacuum of $1\times10^{-3}$ Pa or less, preferably $1\times10^{-5}$ Pa or less by a rate of 60° C./min.

Here, it is assumed that the gas generation peak at a lower temperature range is based on the carbon dioxide gas amount adsorbed onto the complex oxide film and the like and the gas generation peak at a higher temperature range is based on the remaining carbonate salts. In the present invention, gas generation peaks are not limited by such a specific mechanism.

A capacitor can be produced by using as anode the substrate having the complex oxide film of the present invention formed thereon. In this case, metals such as manganese oxide, electroconductive polymer, and nickel can be employed as cathode in the capacitor. By attaching carbon paste thereon, electric resistance can be reduced and further silver paste is attached thereon to form conduction with an external lead.

The thus obtained capacitor, which uses as a dielectric body the complex oxide film of a preferred embodiment of the present invention having a high relative dielectric constant, can achieve a large electrostatic capacitance. Moreover, the dielectric layer in the capacitor can be thin. By this advantage, the capacitor itself can be downsized and the electrostatic capacitance can be further increased.

Thus downsized capacitors can be suitably used in electronic devices, especially as parts in portable devices such as cellular phones.

EXAMPLES

Hereinafter, the present invention will be described in more detail with reference to Examples and Comparative Examples, but the present invention is not restricted thereto.

Example 1

A titanium foil (product of THANK-METAL Co., Ltd.) with purity of 99.9% having a thickness of 20 μm, having been prepared to have a width of 3.3 mm, was cut into 13 mm-long rectangular pieces. One short side of each of the titanium foil piece was fixed to a metal guide by welding. A 0.8 mm-wide line was formed with a solution of polyimide resin (product of UBE INDUSTRIES.LTD.) onto a portion 7 mm from the unfixed end of the foil, and dried at 180° C. for 30 minutes, as preparation for anodic oxidation. The portion of the titanium foil from the unfixed end to the above-formed polyimide resin line was immersed in 5 mass % phosphoric acid aqueous solution to conduct anodic oxidation treatment by applying a voltage of 15 V with electric current density of 30 mA/cm$^2$ at 40° C. for 120 minutes, followed by washing with water and drying. Subsequently, the same area was immersed in a solution where barium hydroxide (product of Nihon Solvay K.K.) of moles of 100 times the mole number of titanium oxide included in the titanium oxide layer was dissolved in 20% tetramethylammonium hydroxide aqueous solution (product of Sacheem Inc.) at 100° C. for 4 hours, to cause reaction. As a result of identification by X-ray diffraction analysis, it was found out that perovskite-type cubical crystal of barium titanate was produced. The foil having the barium titanate layer was immersed in 0.1 N nitric acid at 20° C. for 2 hours. By TEM (Transmission Electron Microscope) observation of the cross section surface of a sample processed with a FIB (Focused Ion Beam) apparatus, the film thickness was found out to be 0.15 μm. The yield of carbon dioxide gas was measured by the following apparatus and conditions.

Apparatus: Thermal Desorption Spectroscopy (product of ESCO, LTD., WA1000S/W)
Vacuum degree at a time of measurement: $1 \times 10^{-5}$ Pa or less
Rate of temperature increase: 60° C./min The sample having formed the complex oxide film thereon was heated under the condition. The yield of gas (ion intensity) having a mass number of 44 with rising temperature was measured. The results are shown in FIG. 1. The ion intensity on the vertical axis corresponds to the yield of carbon dioxide gas. In the temperature range from about 60 to 400° C., a peak attributable to carbon dioxide gas adsorbed to the sample was observed while in the temperature range over 400° C., no peak was observed. The ratio of carbon dioxide gas amount (the ratio of ion intensity) generated at 450° C. to those generated at 650° C. was 0.9.

The capacitance was measured by immersing each foil piece sample up to 4.5 mm from the unfixed end in an electrolyte (10 mass % aqueous ammonium adipate solution), using the metal guide as an anode and using as a cathode a platinum film having a size of 100 mm×100 mm×0.02 mm provided in the electrolyte at a position 50 mm apart from the sample having the complex oxide film formed thereon, with the following apparatus and under the following conditions.
Apparatus: LCR meter (product of NF CORPORATION, ZM2353)
Measuring frequency: 120 Hz
Amplitude voltage: 1 V As a result, the electrostatic capacitance of the sample was found out to be as large as 9.0 μF/cm².

Example 2

Titanium powder having a particle size of 10 μm was molded together with a titanium wire having a diameter of 0.3 mm, and calcined at 1500° C. in a vacuum to thereby obtain a disk-shaped titanium sintered body (having a diameter of 10 mm, a thickness of 1 mm, a pore ratio of 45% and an average pore size of 3 μm). Subsequently, the sintered body was immersed in 5 mass % phosphoric acid aqueous solution and subjected to anodic oxidation treatment by applying a voltage of 15 V with electric current density of 30 mA/cm² at 40° C. for 120 minutes, followed by washing with water and drying. Then, the sintered body was immersed in a solution where barium hydroxide (product of Nihon Solvay K.K.) of moles of 100 times the number of moles of titanium oxide included in the titanium oxide layer was dissolved in 20% tetramethylammonium hydroxide aqueous solution (product of Sacheem Inc.) at 100° C. for 4 hours, to cause reaction. Thus obtained sintered body having the barium titanate layer was immersed in 0.1 N nitric acid at 20° C. for 2 hours.

The ratio of carbon dioxide gas amount (the ratio of ion intensity) generated at 450° C. was about 1.4.

The capacitance was measured by immersing the sintered body having up to a dielectric layer formed thereon in an electrolyte (10% by mass of aqueous ammonium adipate solution), using the titanium wire as an anode, and using as a cathode a platinum film having a size of 100 mm×100 mm×0.02 mm provided in the electrolyte at a position 50 mm apart from the sample having the complex oxide film formed thereon, with the following apparatus and under the following conditions.
Apparatus: LCR meter (product of NF CORPORATION, ZM2353)
Measuring frequency: 120 Hz
Amplitude voltage: 1 V As a result, the electrostatic capacitance of the sample was found out to be as large as 340 μF.

Comparative Example 1

Samples were produced in the same manner as in Example 1 except that an operation of immersing a foil having a barium titanate layer in 0.1 N nitric acid was omitted.

Each sample having a complex oxide film formed thereon was heated in the same process as in Example 1. The yield of gas (ion intensity) having a mass number of 44 with rising temperature was measured. The results are shown in FIG. 2. In the temperature range from about 60 to 400° C., a peak attributable to carbon dioxide gas adsorbed to the sample was observed as in Example 1. In the temperature range from about 500 to 800° C., a peak having a maximum value around 650° C., attributable to carbon dioxide gas adsorbed to the sample was also observed. In the temperature range about from 400 to 500° C., ion intensity was virtually constant and the amount of generated carbon dioxide gas was very small. The ratio of carbon dioxide gas amount (the ratio of ion intensity) generated at 450° C. to those generated at 650° C. was about 14.

Moreover, the sample had an electrostatic capacitance of 6.1 μF/cm² as measured by the same method as in Example 1, and the value here was lower than that of Example 1.

In the Examples, the complex oxide film was used as a dielectric material for a capacitor, but the complex oxide film can be used as a piezoelectric material for a piezoelectric element.

Figure 1:
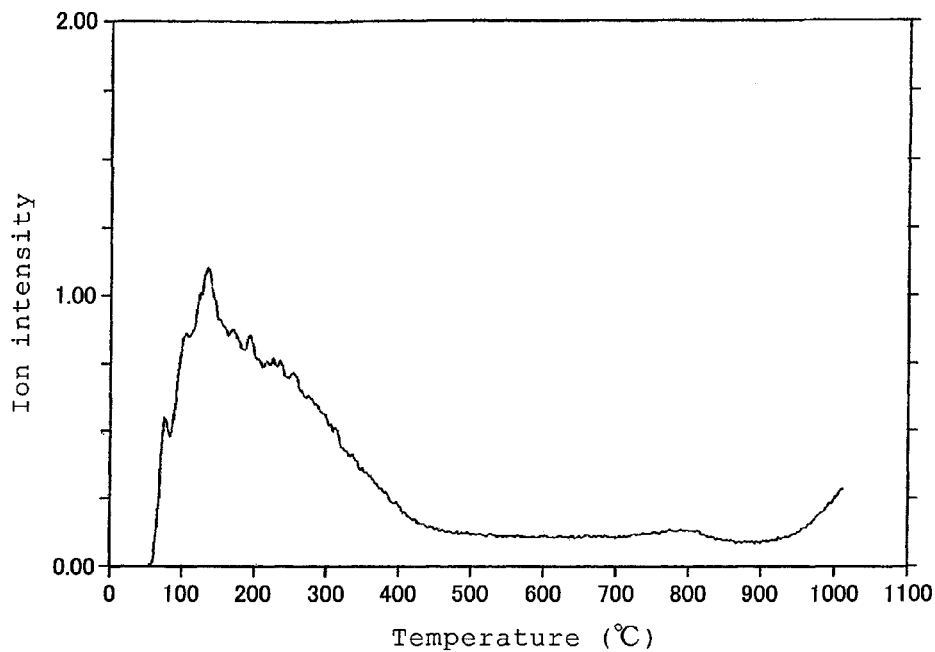
FIG. 1 shows a measurement result of carbon dioxide gas yield with heating of Example 1.
Figure 2:
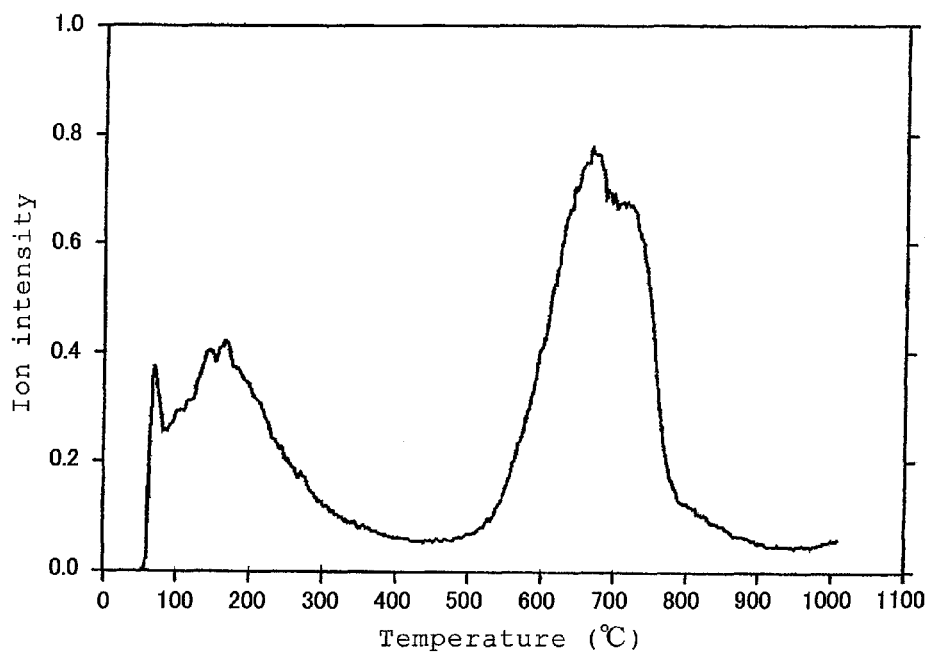
FIG. 2 shows a measurement result of carbon dioxide gas yield with heating of Comparative Example 1.

The invention claimed is:

1. A method for producing a complex oxide film, comprising a first step of forming a metal oxide film containing a first metal element formed on a substrate surface, followed by washing with water and drying, a second step of allowing a solution containing a second metal ion to react with the metal oxide film containing the first metal element to form the complex oxide film containing the first and second metal elements and a step of washing the complex oxide film with an acid solution of pH 5 or less, and
   wherein the metal oxide film is formed by anode oxidation of the substrate, the anode oxidation is conducted at a temperature within a range of 0 to 90° C., the solution containing a second metal ion is allowed to react with the metal oxide film in a temperature range from 40 ° C. to the boiling point of the solution, and the first and second steps are performed at atmospheric pressure.

2. The method for producing a complex oxide film according to claim 1, wherein the first metal is titanium.

3. The method for producing a complex oxide film according to claim 1, wherein the second metal is an alkali earth metal or lead.

4. The method for producing a complex oxide film according to claim 1, wherein the substrate is metal titanium or an alloy containing titanium.

5. The method for producing a complex oxide film according to claim 1, wherein the solution containing a second metal ion is an alkaline solution of pH 11 or more.

6. The method for producing a complex oxide film according to claim 1, wherein the solution containing a second metal ion contains a basic compound which turns into gas through at least one of evaporation, sublimation and thermal decomposition at atmospheric pressure or under reduced pressure.

7. The method for producing a complex oxide film according to claim 6, wherein the basic compound is an organic basic compound.

8. The method for producing a complex oxide film according to claim 7, wherein the organic basic compound is tetramethyl ammonium hydroxide.

\* \* \* \* \*